United States Patent
Itou et al.

(10) Patent No.: US 11,219,929 B2
(45) Date of Patent: Jan. 11, 2022

(54) ELEMENT CHIP CLEANING METHOD, ELEMENT CHIP CLEANING APPARATUS, AND ELEMENT CHIP MANUFACTURING METHOD

(71) Applicant: Panasonic Intellectual Property Management Co., Ltd., Osaka (JP)

(72) Inventors: Akihiro Itou, Kyoto (JP); Atsushi Harikai, Osaka (JP); Toshiyuki Takasaki, Osaka (JP); Hidefumi Saeki, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/896,338

(22) Filed: Jun. 9, 2020

(65) Prior Publication Data

US 2020/0406308 A1    Dec. 31, 2020

(30) Foreign Application Priority Data

Jun. 25, 2019 (JP) .............................. JP2019-117805

(51) Int. Cl.
*B08B 3/08* (2006.01)
*B08B 3/04* (2006.01)

(52) U.S. Cl.
CPC ................ *B08B 3/08* (2013.01); *B08B 3/041* (2013.01)

(58) Field of Classification Search
CPC combination set(s) only.
See application file for complete search history.

(56) References Cited

U.S. PATENT DOCUMENTS

2012/0312334 A1\* 12/2012 Dobashi ............ H01L 21/31133
                                                            134/30
2016/0035577 A1\* 2/2016 Lei ......................... B23K 26/40
                                                            438/462

FOREIGN PATENT DOCUMENTS

JP      2016-136558 A    7/2016

\* cited by examiner

*Primary Examiner* — Erin F Bergner
(74) *Attorney, Agent, or Firm* — Pearne & Gordon LLP

(57) ABSTRACT

An element chip cleaning method including: an element chip preparation step of preparing at least one element chip having a first surface and a second surface opposite the first surface, the first surface covered with a resin film; a first cleaning step of bringing a first cleaning liquid into contact with the resin film, the first cleaning liquid including a solvent that dissolves at least part of a resin component contained in the resin film; and a second cleaning step of spraying a second cleaning liquid against the resin film from the first surface side of the element chip, after the first cleaning step.

9 Claims, 15 Drawing Sheets and ELEMENT CHIP CLEANING METHOD, ELEMENT CHIP CLEANING APPARATUS, AND ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-117805 filed on Jun. 25, 2019, of which entire content is incorporated herein by reference into the present application.

TECHNICAL FIELD

The present invention relates to an element chip cleaning method, an element chip cleaning apparatus, and an element chip manufacturing method.

BACKGROUND

Plasma dicing has been attracting attention as a method for dicing a substrate. On the surface of a substrate subjected to plasma dicing, element regions other than regions to be plasma-etched (dicing regions) are covered with a mask. The mask is removed after plasma dicing.

Patent Literature 1 (JP 2016-136558 A) discloses a two-fluid cleaning method as a method of removing the mask. The two-fluid cleaning method utilizes physical action to remove the mask by colliding minute droplets accelerated by a carrier gas with the element regions, and has excellent cleaning effect.

SUMMARY

In the two-fluid cleaning method, however, the accelerated droplets may also collide with bumps and devices, such as MEMS, LED, and laser (hereinafter collectively referred to as electronic components) that are disposed in the element regions exposed after the removal of the mask. This means that the two-fluid cleaning may peel off not only the mask but also the electronic components, from the element chips. Furthermore, in the element chips obtained by plasma dicing, the mask may become hardened or modified by heat or ultraviolet rays during plasma irradiation. In this case, the adhesion between the mask and the electronic components tends to be strong. Increasing the acceleration of the droplets in order to remove the strongly adhering mask causes the electronic components to be more likely to be peeled off.

One aspect of the present invention relates to an element chip cleaning method including: an element chip preparation step of preparing at least one element chip having a first surface and a second surface opposite the first surface, the first surface covered with a resin film; a first cleaning step of bringing a first cleaning liquid into contact with the resin film, the first cleaning liquid including a solvent that dissolves at least part of a resin component contained in the resin film; and a second cleaning step of spraying a second cleaning liquid against the resin film from the first surface side of the element chip, after the first cleaning step.

Another aspect of the present invention relates to a cleaning apparatus including: a table for supporting an element chip, a first supply unit for supplying a first cleaning liquid to the element chip supported on the table, a second supply unit for spraying a second cleaning liquid to the element chip supported on the table, and a controller for controlling the first supply unit and the second supply unit, wherein the controller controls the first supply unit and the second supply unit such that the spraying of the second cleaning liquid to the element chip starts after completion of the supplying of the first cleaning liquid to the element chip.

Yet another aspect of the present invention relates to an element chip manufacturing method including: a substrate preparation step of preparing a substrate having a plurality of element regions and a dicing region defining the element regions, the substrate having a first surface and a second surface opposite the first surface; a resin film formation step of forming a resin film that covers the first surface; an opening formation step of forming an opening in the resin film, to expose the dicing region on the first surface; a plasma dicing step of plasma-etching the exposed dicing region starting from the first surface until etched to the second surface, to divide the substrate into a plurality of element chips; and a resin film removal step of removing the resin film covering the first surface from the element chips, after the plasma dicing step, wherein the resin film removal step includes: a first cleaning step of bringing a first cleaning liquid into contact with the resin film, the first cleaning liquid including a solvent that dissolves at least part of a resin component contained in the resin film; and a second cleaning step of spraying a second cleaning liquid to the resin film from the first surface side of the element chips, after the first cleaning step.

According to the present invention, high-quality element chips can be obtained.

DETAILED DESCRIPTION

In the present embodiment, prior to applying a physical force to the resin film by spraying a cleaning liquid thereto, a solvent that dissolves at least part of the resin component contained in the resin film is brought into contact with the resin film. This allows at least part of the resin component to dissolve or swell, weakening the adhesion between the resin film and the element chip. Therefore, by spraying a cleaning liquid against the resin film in a later process, the resin film can be easily removed. In addition, the swollen resin film acts as a protective material, reducing the momentum of the ejected cleaning liquid when reaching the element chip. In this way, the peeling-off of the electronic components can be suppressed.

The element chip cleaning method according to the present embodiment is executed using an apparatus including two cleaning-liquid supply units. The present embodiment encompasses a cleaning apparatus including two cleaning-liquid supply units.

The element chip cleaning method according to the present embodiment is particularly suitable as a method for removing the resin film from the element chips produced by plasma dicing. The present embodiment encompasses an element chip manufacturing method including a plasma dicing step.

A. Element Chip Cleaning Method

The element chip cleaning method according to the present embodiment includes: an element chip preparation step of preparing at least one element chip having a first surface and a second surface opposite the first surface, the first surface covered with a resin film; a first cleaning step of bringing a first cleaning liquid into contact with the resin film, the first cleaning liquid including a solvent that dissolves at least part of a resin component contained in the resin film; and a second cleaning step of spraying a second cleaning liquid against the resin film from the first surface side of the element chip, after the first cleaning step.

Figure 1:
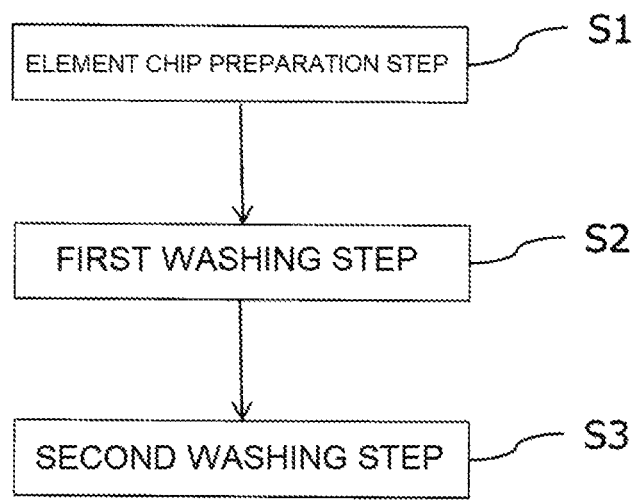
FIG. 1 is a flowchart of an element chip cleaning method according to an embodiment of the present invention.

FIG. 1 is a flowchart of the element chip cleaning method according to the present embodiment.

(i) Element Chip Preparation Step (S1)

This step prepares at least one element chip having a first surface and a second surface opposite the first surface, the first surface covered with a resin film.

The element chip includes, for example, a semiconductor layer and a wiring layer.

The semiconductor layer contains, for example, silicon (Si), gallium arsenide (GaAs), gallium nitride (GaN), or silicon carbide (SiC). The semiconductor layer in the element chip may have any thickness; the thickness is, for example, 20 μm or more and 1000 μm or less, and may be 100 μm or more and 300 μm or less.

The wiring layer constitutes, for example, a semiconductor circuit, an electronic component element (e.g., LED, laser, MEMS), and may include an electrically insulating film, a metal material, a resin layer (e.g., polyimide), a resist layer, an electrode pad, a bump, and others. The insulating film may be in the form of a laminate with a wiring metal material (e.g., multilevel wiring layer, redistribution layer).

The resin film contains a resist material, such as a thermosetting resin (e.g., polyimide), a photoresist (e.g., phenol resin), or a water-soluble resist (e.g., acrylic resin).

The resin film may have any thickness, but is preferably thick enough not to be completely removed by plasma etching in the plasma dicing step. The thickness of the resin film is set, for example, to be greater than a calculated amount (thickness) of the resin film to be etched in the plasma dicing step. The thickness of the resin film is, for example, 5 μm or more and 60 μm or less.

In view of ease of handling, the plurality of element chips may be attached on a holding sheet secured to a frame surrounding the plurality of element chips. In this case, the plurality of element chips can be processed all at once. The plurality of the element chips are spaced apart from each other. The space between the adjacent element chips may be set as appropriate according to, for example, the size of the element chips. A member including the frame and the holding sheet secured on the frame is referred to as a conveying carrier.

(Conveying Carrier)

The frame is a frame member having an opening equal to or greater in area than the whole substrate, and has a predetermined width and a substantially consistent thin thickness. The frame has such a rigidity that it can be conveyed with the holding sheet and the substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the substrate thereto, the holding sheet preferably includes an adhesive layer and a non-adhesive layer with flexibility.

The non-adhesive layer may be made of any material, for example, polyolefin such as polyethylene and polypropylene, polyester such as polyvinyl chloride and polyethylene terephthalate, and other thermoplastic resins. The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover an opening of the frame. On the adhesive side exposed from the opening of the frame, the element chip is attached, with one of its principal surfaces (second surface) in contact with the adhesive side. The element chip is thus held on the holding sheet. The element chip may be held on the holding sheet via a die attach film (DAF).

The adhesive layer is preferably made of an adhesive component, the adhesive strength of which is reduced by ultraviolet (UV) irradiation. In picking up the element chip after the resin film is removed, the element chip can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less (preferably 5 μm or more and 15 μm or less).

Figure 2A:
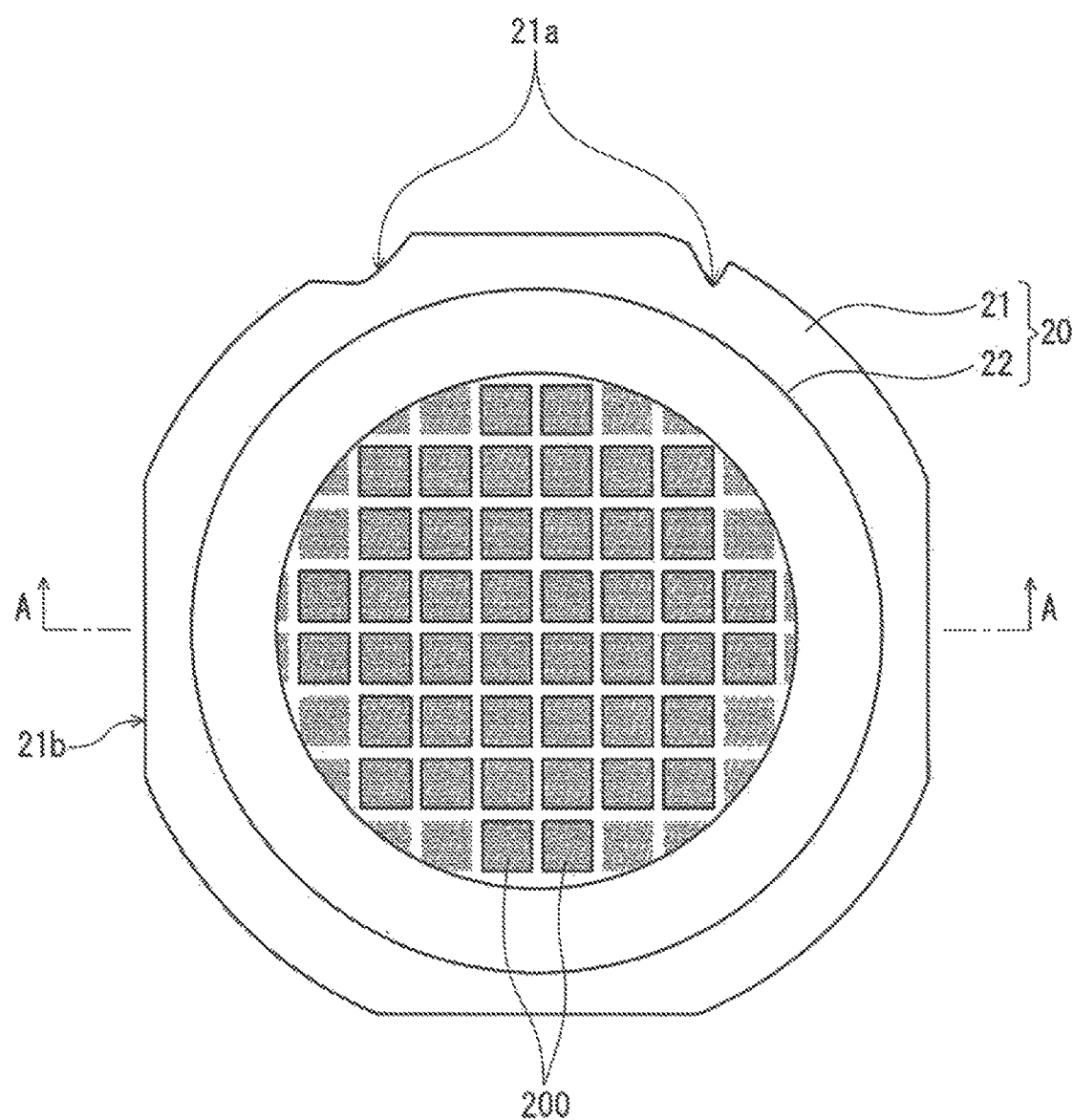
FIG. 2A is a schematic top view of a plurality of element chips prepared in an element chip preparation step according to an embodiment of the present invention.
Figure 2B:
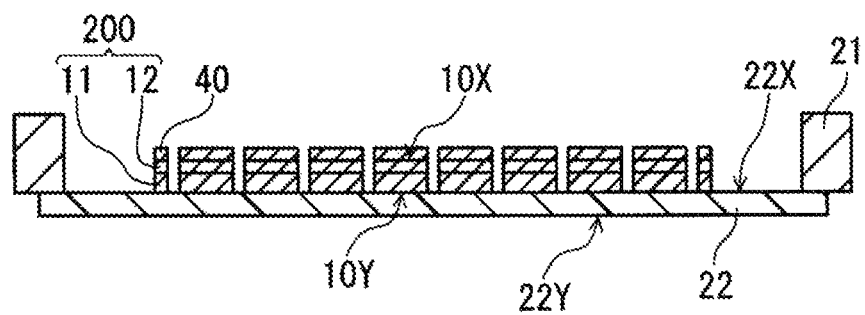
FIG. 2B is a cross-sectional view taken along a line A-A of FIG. 2A.

FIG. 2A is a schematic top view of a plurality of element chips prepared in the element chip preparation step, and FIG. 2B is a cross-sectional view taken along a line A-A of FIG. 2A.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and is attached at its periphery of the adhesive side 22X to one side of the frame 21. On a portion of the adhesive side 22X exposed from the frame 21, an element chip 200 is placed, with a second surface 10Y facing the portion.

On the adhesive side 22X of the holding sheet 22, a plurality of the element chips 200 are attached with a space between them. The element chips 200 each include a semiconductor layer 11 and a wiring layer 12 disposed on the first surface side of the semiconductor layer 11. The wiring layer 12 is covered with a rein film 40.

(ii) First Cleaning Step (S2)

This step brings a first cleaning liquid into contact with the resin film, the first cleaning liquid including a solvent that dissolves at least part of the resin component contained in the resin film. This allows at least part of the resin component to dissolve or swell, weakening the adhesion between the resin film and the first surface of the element chip and forming a protective material from the swollen resin film. The protective material protects the element chip from a subsequent spraying of a second cleaning liquid. Part of the resin component of the resin film may be removed in the first cleaning step.

The solvent may be selected as appropriate according to the resin component contained in the resin film. The resin film contains, as described above, a resist material, such as a thermosetting resin (e.g., polyimide), a photoresist (e.g., phenol resin), or a water-soluble resist (e.g., acrylic resin). Examples of the solvent to dissolve these materials include propylene glycol monomethyl ether acetate (PGMEA), isopropyl alcohol (IPA), ethanol, acetone, and water. The first cleaning liquid includes these solvents singly or in combination of two or more kinds. The first cleaning liquid preferably includes PGMEA as the solvent, because in this case, the holding sheet is hardly dissolved. PGMEA may be used in combination with water.

The first cleaning liquid may be brought into contact with the resin film in any way. For example, the first cleaning liquid may be supplied as it is in a liquid state to the element chip, or the first cleaning liquid in the form of mist or foam may be supplied to the element chip. Preferably, the first cleaning liquid is discharged as it is in a liquid state toward the resin film from the first surface side of the element chip. The first cleaning liquid in a liquid state has fluidity and spreads evenly over the resin film. Therefore, the resin film is likely to swell. Furthermore, due to the surface tension, the first cleaning liquid can form a film on the resin film. In this case, in a later second cleaning step, the impact of the second cleaning liquid on the element chip can be further weakened, suppressing damage to the element chip. In addition, the supplying of the first cleaning liquid and the spraying of the second cleaning liquid can be carried out successively in the same apparatus without moving the element chip, which can improve the productivity.

The supply amount of the first cleaning liquid is not limited, and may be set as appropriated according to the resin component, the kind of the solvent, the degree of dissolution, and others. When the element chip is held by a conveying carrier, the first cleaning liquid may be supplied in such an amount that a region without the substrate (peripheral region) of the holding sheet comes in contact with the first cleaning liquid. Usually, the frame is thicker than the element chip. By supplying the first cleaning liquid to within the space surrounded by the frame, a sufficient amount of the first cleaning liquid can be supplied to the resin film. This facilitates the formation of a film of the first cleaning liquid on the resin film. Note that the first cleaning liquid may not be supplied to an extent that fills the space surrounded by the frame. It suffices if the first cleaning liquid is supplied to an extent that fills the gaps between a plurality of the element chips attached on the holding sheet. Due to capillary phenomenon, the first cleaning liquid is likely to enter the gaps. By the entry of the first cleaning liquid between the element chips, the first cleaning liquid tends to be distributed also on the resin film, forming a film of the first cleaning liquid that covers the first surface and the side surface of the element chip. Before supplying the first cleaning liquid to the element chip, the element chip may be exposed to a plasma generated from a gas containing oxygen, to slightly ash the resin film. This enhances the hydrophilicity of the surface of the resin film, facilitating the entry of the first cleaning liquid between the element chips.

While supplying the first cleaning liquid to the element chip, a nozzle for supplying the first cleaning liquid may be moved, or the element chip may be rotated, together with the conveying carrier, about a line normal to the first surface. In this way, the first cleaning liquid can be evenly supplied onto the resin film. Moreover, the resin film dissolved or peeled off can be quickly removed from the first surface. The element chip may be rotated at any speed; the rotation speed may be 100 rpm or less, and may be 5 rpm or more 30 rpm or less.

The first cleaning liquid may have any viscosity. In view of the productivity, the viscosity of the first cleaning liquid at 20° C. as measured in accordance with JIS Z 8803 may be 1 mPa·s or more and 1000 mPa·s or less.

Figure 3:
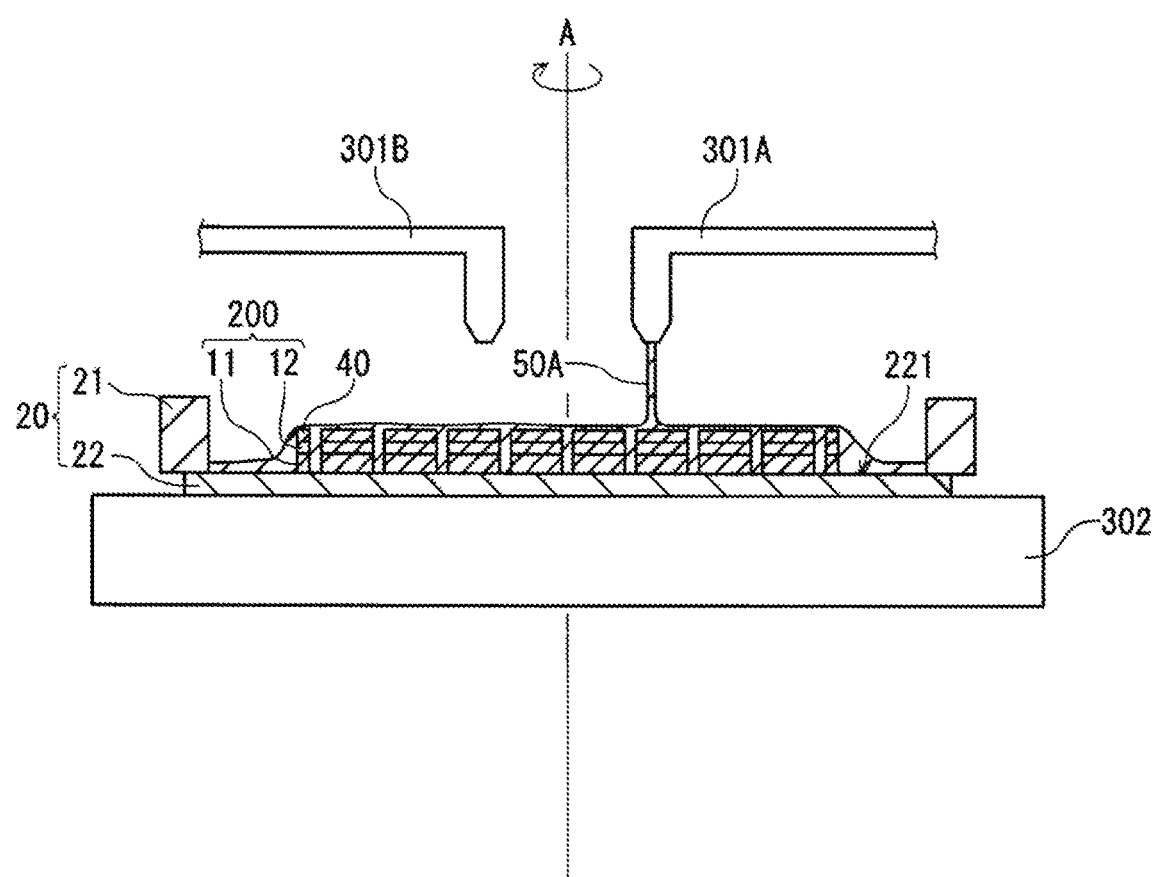
FIG. 3 is a schematic cross-sectional view of a substrate in a first cleaning step according to the embodiment of the present invention.

FIG. 3 is a schematic cross-sectional view of the substrate in the first cleaning step. A plurality of the element chips 200 are held by the conveying carrier 20 and supported on a table 302. The table 302 is rotatable about a line normal to its supporting surface. The plurality of the element chips 200 rotate together with the conveying carrier about an axis X being a line normal to the first surface of the element chips and passing through the center of the conveying carrier 20. A first cleaning liquid 50A is discharged as it is in a liquid state, from a first supply unit (first nozzle 301A) toward the resin film 40 from a first surface 10X side of the element chips 200. The discharged first cleaning liquid 50A covers the resin film 40, as well as part of a peripheral region 221 of the holding sheet 22. A film of the first cleaning liquid 50A is formed on the resin film 40.

(iii) Second Cleaning Step (S3)

This step sprays a second cleaning liquid against the resin film from the first surface side of the element chip. The resin film is removed by physical action, i.e., collision of the second cleaning liquid with the resin film.

The second cleaning liquid may be sprayed together with a gas against the resin film. This is called a two-fluid cleaning method, in which minute droplets are accelerated by a gas (carrier gas) and collided with the resin film. The two-fluid cleaning method exhibits a very high cleaning effect on one hand, but on the other hand, it may cause damage to the element chip. According to the present embodiment, since the adhesion of the resin film is weakened by pretreatment, the resin film can be removed under relatively mild conditions. Therefore, the damage to the element chip can be suppressed. Even when the two-fluid cleaning is performed under the same conditions as conventionally used, since the swollen resin film itself and, further, the film of the first cleaning liquid covering the element chip act as a protective material for protecting the element chip, the damage to the element chip can be suppressed.

The ejection conditions of the second cleaning liquid are not limited, and may be set as appropriated according to the thickness of the resin film, the structure of the wiring layer, and others. In the two-fluid cleaning method, for example, the pressure of the carrier gas may be set to 0.1 MPa or more and 0.7 MPa or less, the flow rate of the carrier gas may be set to 80 L/min or more and 200 L/min or less, the pressure of the second cleaning liquid may be set to 0.1 MPa or more and 0.5 MPa or less, the flow rate of the second cleaning liquid may be set to 100 mL/min or more and 500 mL/min or less, and the distance between the tip of the nozzle and the resin film may be set to 5 mm or more and 20 mm or less.

The second cleaning liquid is not limited, and may include a solvent similar to or the same as the solvent included in the first cleaning liquid. The solvent included in the first cleaning liquid and the solvent included in the second cleaning liquid may be of the same kind or different kinds. In terms of costs, the solvents in the first and second cleaning liquids may be of the same kind.

The carrier gas is not limited, and may be a known gas used in the two-fluid cleaning method. Examples of the carrier gas include nitrogen, dry air, and water vapor.

While spraying the second cleaning liquid against the resin film, the element chip may be rotated, together with the conveying carrier, about a line normal to the first surface. In this way, the peeled resin film can be quickly removed from the first surface. The conveying carrier may be rotated at any speed; the rotation speed may be 100 rpm or more, and may be 300 rpm or more.

The first cleaning step and the second cleaning step may be each performed a plurality of times. For example, the combination of the first and the second cleaning step may be performed a plurality of times. After the first cleaning step and the second cleaning step, the second cleaning step may be performed again, as needed.

Figure 4:
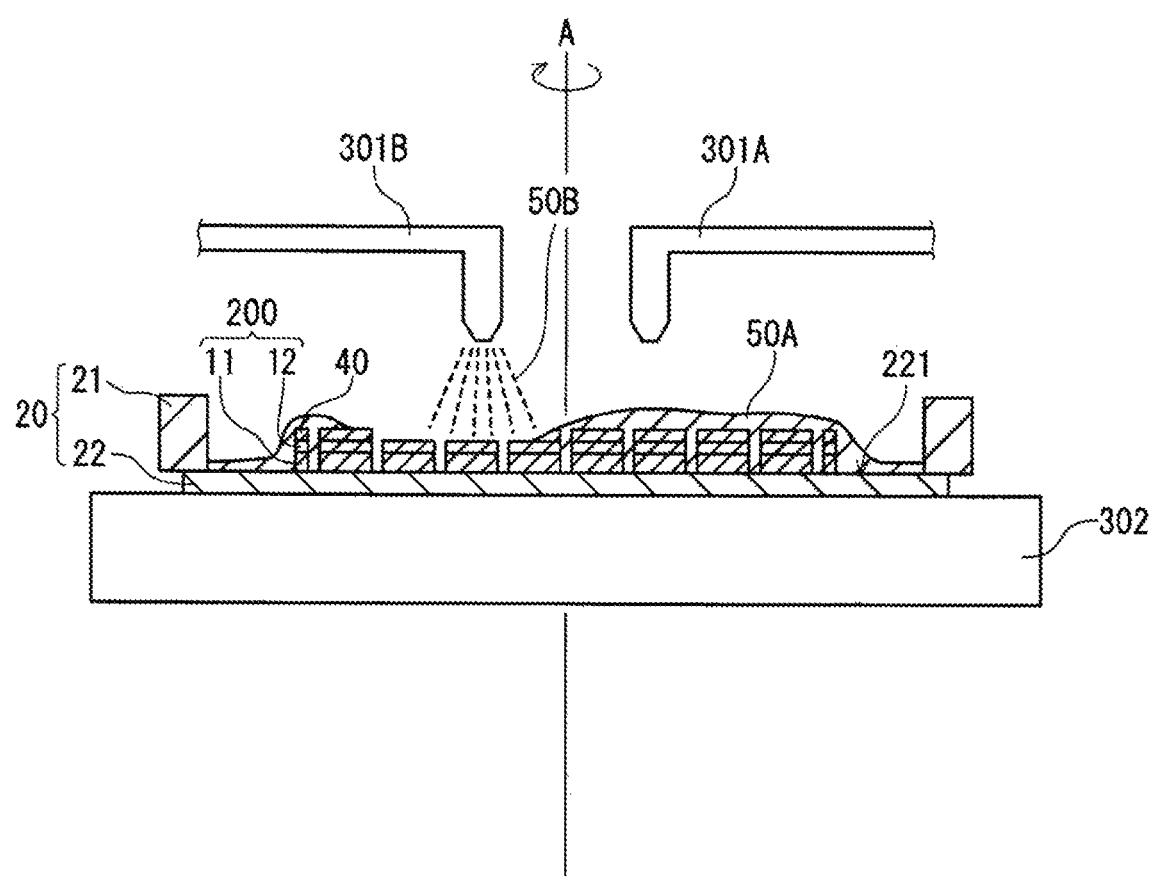
FIG. 4 is a schematic cross-sectional view of the substrate in a second cleaning step according to the embodiment of the present invention.

FIG. 4 is a schematic cross-sectional view of the substrate in the second cleaning step. The plurality of the element chips 200 are rotating together with the conveying carrier about the axis X. A second cleaning liquid 50B is sprayed toward the swollen resin film 40 from a second supply unit (second nozzle 301B). On the resin film 40, a film of the first cleaning liquid 50A is formed. Therefore, when the ejected second cleaning liquid 50B reaches the resin film 40, the pressure at the time of ejection is weakened. This suppresses the damage to the element chip.

B. Cleaning Apparatus

A cleaning apparatus according to the present embodiment includes a table for supporting an element chip, a first supply unit for supplying a first cleaning liquid to the element chip supported on the table, a second supply unit for supplying a second cleaning liquid to the element chip supported on the table, and a controller for controlling the first supply unit and the second supply unit.

A conceptual diagram of the cleaning apparatus is shown, for example, in FIGS. 3 and 4.

The controller controls the first supply unit and the second supply unit such that the spraying of the second cleaning liquid to the element chip starts after completion of the supplying of the first cleaning liquid to the element chip. By controlling as above, the second cleaning liquid is sprayed against the resin film which has been swollen by the first cleaning liquid. This eases the removal of the resin film.

The cleaning apparatus may further include a rotation unit for rotating the table. In this case, the controller controls the rotation unit and the first supply unit such that the supplying of the first cleaning liquid is performed on the rotating element chip. In the supplying of the second cleaning liquid, too, the table may be rotated.

The first supply unit includes, for example, a nozzle (first nozzle), a tank for storing the first cleaning liquid, and a pump for adjusting the pressure of the first cleaning liquid to be discharged. The first nozzle has an opening at the tip. The first cleaning liquid is fed from the tank to the first nozzle, and then discharged through the opening in a predetermined amount and at a predetermined pressure. The opening of the first nozzle may have any shape, and is, for example, circular, or slit-like in shape.

The second supply unit includes, for example, a nozzle (second nozzle), a tank for storing the second cleaning liquid, a tank for storing a carrier gas, and a pump for adjusting the pressure of the carrier gas. The second nozzle has an opening at the tip. The second cleaning liquid and the carrier gas are fed from each tank via different paths to the second nozzle, and then mixed together within the second nozzle and ejected through the opening. The pressure at the time of ejection of the second cleaning liquid is adjusted by adjusting the pressure of the carrier gas. The opening of the second nozzle may have any shape, and is, for example, circular, or slit-like in shape.

The rotation unit include, for example, a rotary member connected to the table, and a motor for driving the rotary member to rotate. The cleaning apparatus may include a moving unit for translationally and/or vertically moving the first nozzle and the second nozzle. The controller includes, for example, a computer, and controls the first supply unit, the second supply unit, the rotation unit, and the moving unit.

Figure 5:
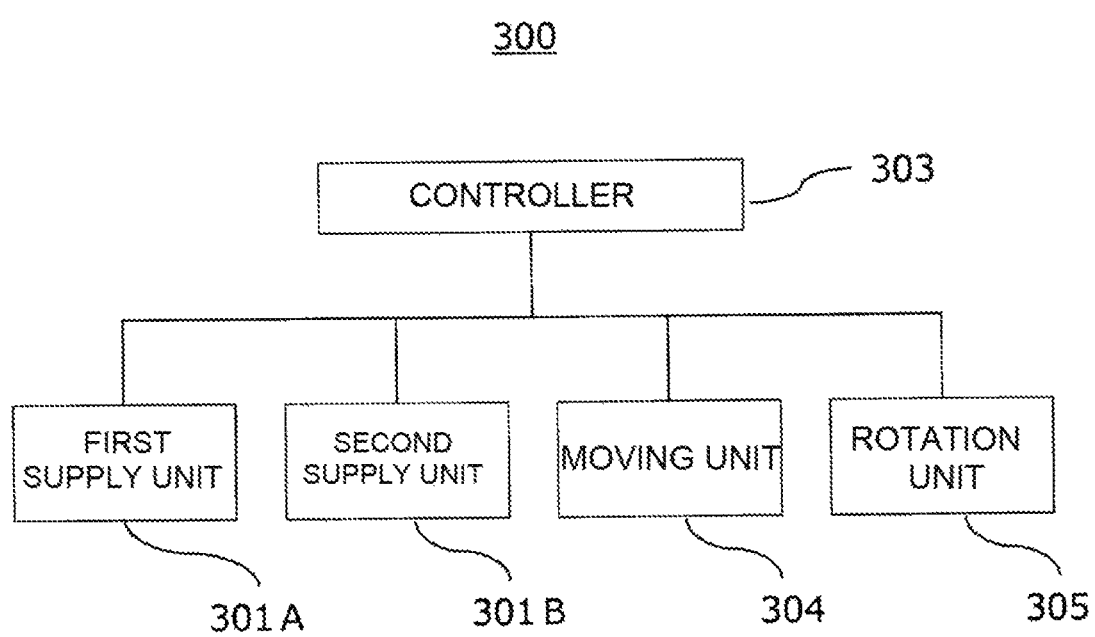
FIG. 5 is a block diagram of a cleaning apparatus used in an embodiment of the present invention.

FIG. 5 is a block diagram of a cleaning apparatus used in the present embodiment. A cleaning apparatus 300 includes a first supply unit 301A for supplying the first cleaning liquid, a second supply unit 301B for spraying the second cleaning liquid, a moving unit 304 for translationally and/or vertically moving the first nozzle and the second nozzle, a rotation unit 305 for rotating the table, and a controller 303 for controlling the first supply unit 301A, the second supply unit 301B, the moving unit 304 and the rotation unit 305.

C. Element Chip Manufacturing Method

An element chip manufacturing method includes: a substrate preparation step of preparing a substrate having a plurality of element regions and a dicing region defining the element regions, the substrate having a first surface and a second surface opposite the first surface; a resin film formation step of forming a resin film that covers the first surface; an opening formation step of forming an opening in the resin film, to expose the dicing region on the first surface; a plasma dicing step of plasma-etching the exposed dicing region starting from the first surface until etched to the second surface, to divide the substrate into a plurality of element chips; and a resin film removal step of removing the resin film covering the first surface from the element chips, after the plasma dicing step. The resin film removal step includes: a first cleaning step of bringing a first cleaning liquid into contact with the resin film, the first cleaning liquid including a solvent that dissolves at least part of a resin component contained in the resin film; and a second cleaning step of spraying a second cleaning liquid to the resin film from the first surface side of the element chips, after the first cleaning step.

Figure 6:
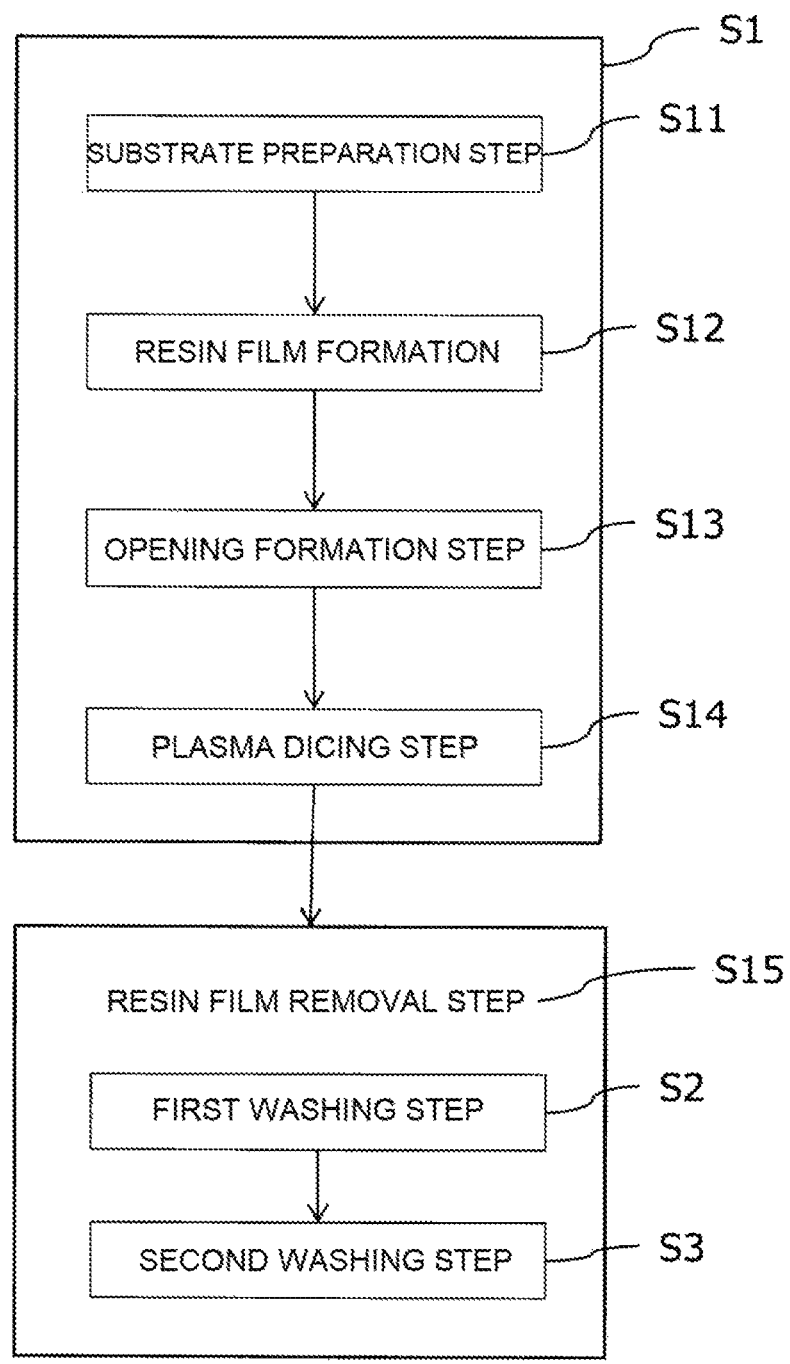
FIG. 6 is a flowchart of an element chip manufacturing method according to an embodiment of the present invention.

FIG. 6 is a flowchart of an element chip manufacturing method according to the present embodiment.

(1) Substrate Preparation Step (S11)

A substrate subjected to dicing is prepared first.

(Substrate)

The substrate has a first surface and a second surface and includes a plurality of element regions and a dicing region defining the element regions. The substrate includes a semiconductor layer. The element regions of the substrate may further include a wiring layer. The dicing region of the substrate may further include an electrically insulating film and a metal material, such as TEG (Test Element Group). Etching the substrate along the dicing region provides a plurality of element chips.

The substrate may be of any size, and is, for example, about 50 mm to 300 mm in maximum diameter. The substrate may be of any shape, and is, for example, circular or rectangular. The substrate may be provided with a cut, such as an orientation flat or a notch.

The shape of the dicing region may be set as appropriate according to the shape of desired element chips, without limited to a straight linear shape, and may be, for example, a zigzag shape or a wavy line shape. The element chip is, for example, rectangular or hexagonal in shape.

The width of the dicing region may be set as appropriate according to the sizes of the substrate and the element chips, and others. The width of the dicing region is, for example, 10 μm or more and 300 μm or less. A plurality of the dicing regions may have the same width or different widths. The dicing region is typically formed in plural numbers on the substrate. The pitch between the dicing regions adjacent to each other also may be set as appropriate according to the sizes of the substrate and the element chips, and others.

(2) Holding Step

The substrate is attached at the second surface to a holding sheet secured on a frame. This increases the ease of handling. Dividing the substrate attached to the holding sheet provides a plurality of element chips that are spaced apart from each other on the holding sheet. The shape, material, etc. of the frame and the holding sheet are as described above.

Figure 7:
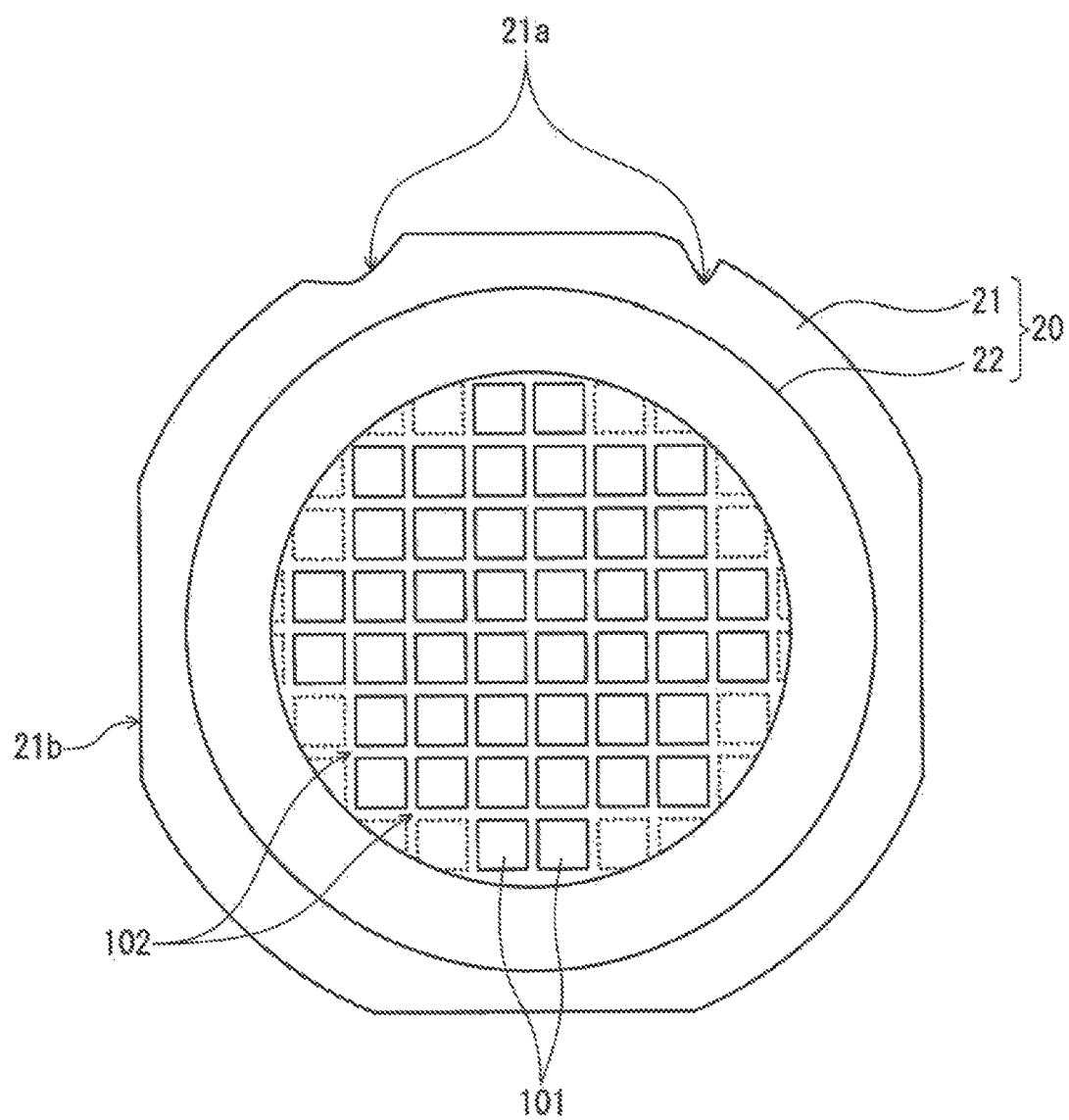
FIG. 7 is a schematic top view of a substrate according to an embodiment of the present invention.
Figure 8:
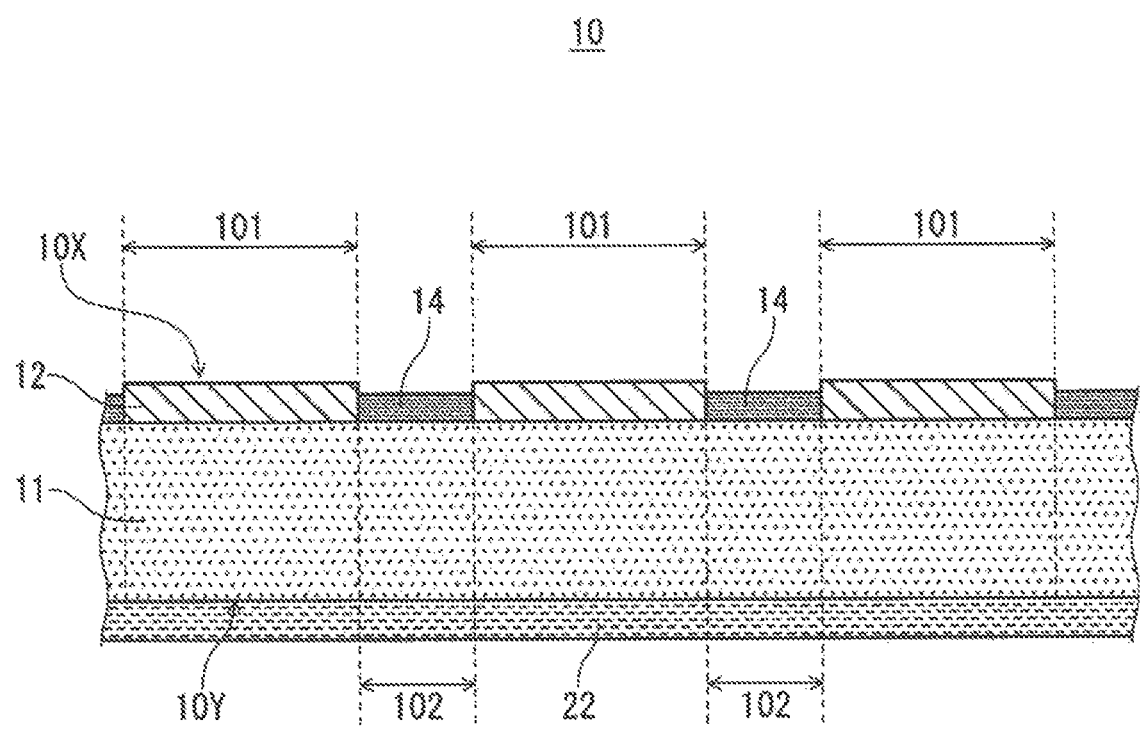
FIG. 8 is a schematic partial cross-sectional view of a substrate prepared in a preparation step according to an embodiment of the present invention.

FIG. 7 is a schematic top view of the substrate after the holding step according to the present embodiment. FIG. 8 is a schematic partial cross-sectional view of the substrate after the holding step according to the present embodiment.

A substrate 10 has a first surface 10X and a second surface 10Y, and includes a plurality of element regions 101 and a dicing region 102 defining the element regions 101. The element regions 101 include a semiconductor layer 11 and a wiring layer 12 laminated on the semiconductor layer 11 on the first surface 10X side. The dicing region 102 includes the semiconductor layer 11 and an electrically insulating film 14. The substrate 10 is attached at the second surface 10Y to a holding sheet 22 included in a conveying carrier 20.

(3) Resin Film Formation Step (S12)

This step forms a resin film that covers the first surface of the substrate.

The resin film is provided for protecting the element regions of the substrate from plasma exposure and the like. The resin film is removed after the plasma dicing step. The material, thickness, etc. of the resin film are as described above.

The resin film can be formed by, for example, forming a resist material into a sheet and attaching the sheet to the substrate, or by applying a liquid raw material of a resist material to the substrate using a spin-coating or spray-coating technique. By changing the amount of the liquid raw material while applying, the thickness of the resin film can be partially changed. Spin-coating and spray-coating may be used in combination, and thereby the coating amount may be adjusted.

Figure 9:
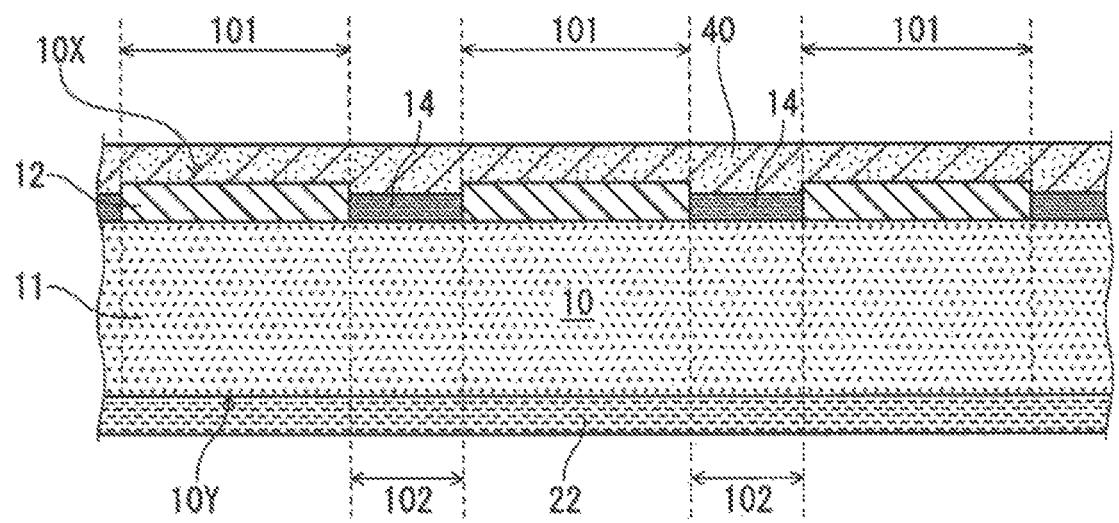
FIG. 9 is a schematic partial cross-sectional view of the substrate after a resin film formation step according to the embodiment of the present invention.

FIG. 9 is a schematic partial cross-sectional view of the substrate after the resin film formation step according to the present embodiment. On the first surface 10X of the substrate 10, the resin film 40 is formed.

(4) Opening Formation Step (S13)

This step forms an opening in the resin film, to expose the dicing region on the first surface.

The opening is formed by, for example, removing the resin film formed from a photoresist, along the dicing region by photolithography. The opening may be formed by removing the resin film formed from a thermosetting resin or from a water-soluble resist, along the dicing region by laser-scribing patterning.

The opening may be formed by removing the resin film and the wiring layer along the dicing region. The removal of the wiring layer along the dicing region may be performed in a later-described plasma dicing step. In this case, the conditions for generating a plasma for removing the wiring layer can differ from those for etching the substrate.

After the opening formation step and before the plasma dicing step, a step of cleaning the opening by a laser beam or a plasma may be performed. A laser beam in the cleaning process is usually irradiated under different conditions than a laser beam used in the opening formation step. Likewise, a plasma used in the cleaning step is usually generated under different conditions than a plasma generated when dicing is performed. The cleaning step is performed for the purpose of, for example, reducing a residue caused by the opening formation step. This can improve the quality of plasma etching.

Figure 10:
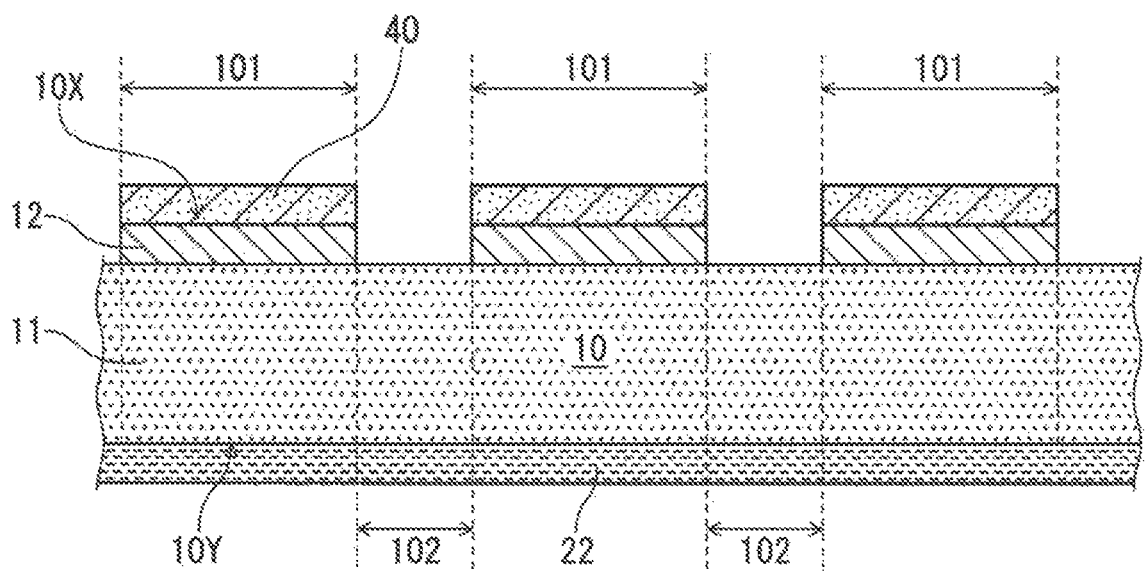
FIG. 10 is a schematic partial cross-sectional view of the substrate after an opening formation step according to the embodiment of the present invention.

FIG. 10 is a schematic partial cross-sectional view of the substrate after the opening formation step according to the present embodiment. The resin film 40 and the wiring layer 12 in the dicing region 102 are removed, and the semiconductor layer 11 in the divided region 102 is exposed from the opening.

(5) Plasma Dicing Step (S14)

This step exposes the substrate to a plasma, to etch the dicing region exposed from the opening until etched to the second surface, thereby to form a plurality of element chips from the substrate. The plurality of the element chips are obtained in a state held on the holding sheet.

Figure 11:
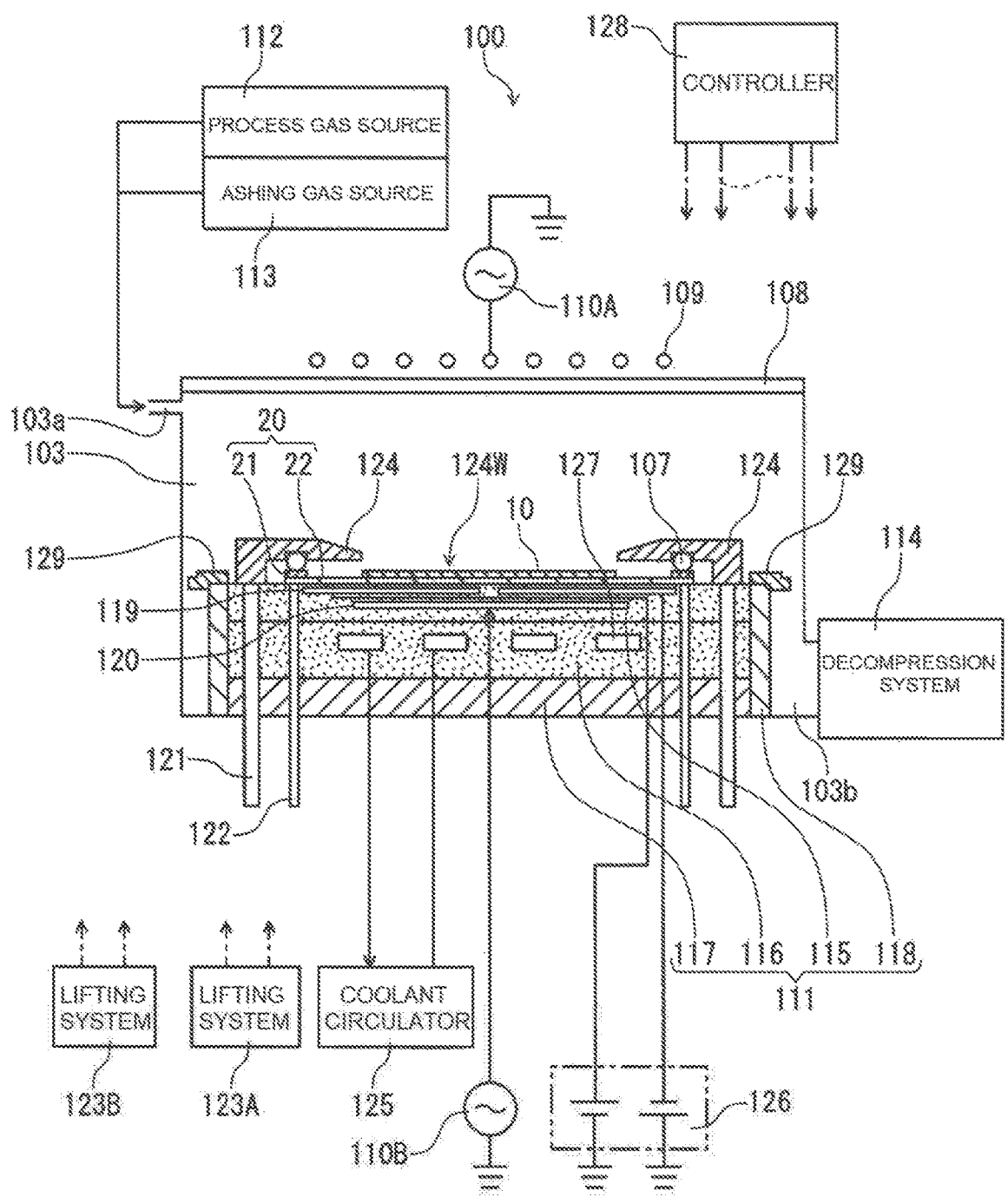
FIG. 11 is a schematic sectional diagram of a plasma processing apparatus used in an embodiment of the present invention.

A plasma processing apparatus 100 used for plasma etching will be specifically described with reference to FIG. 11. The plasma processing apparatus is not limited thereto. FIG. 11 is a schematic sectional diagram of the plasma processing apparatus 100, in which the resin film 40 is omitted for the sake of convenience.

(Plasma Processing Apparatus)

The plasma processing apparatus 100 includes a stage 111. The conveying carrier 20 is set on the stage 111, with the surface holding the substrate 10 of the holding sheet 22 faced upward. The stage 111 has such a size that the whole conveying carrier 20 can be seated thereon. Above the stage 111, a cover 124 having a window 124W for exposing at least part of the substrate 10 therefrom is arranged. The cover 124 is provided with holding members 107 for holding the frame 21 downward while the frame 21 is on the stage 111. The holding members 107 are preferably a member that can achieve point contact with the frame 21 (e.g., a coil spring or an elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is positioned on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting the gas within the vacuum chamber 103 to reduce the pressure therein. While supplying a process gas into the vacuum chamber 103, the first electrode 109 is supplied with a high-frequency power from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as listed above.

Within the electrode layer 115, an electrode for electrostatic chucking (hereinafter, ESC electrode 119), and a second electrode 120 electrically connected to a second high-frequency power source 110B are disposed. The ESC electrode 119 is electrically connected to a DC power source 126. The ESC electrode 119 and the DC power source 126 constitute an electrostatic chuck system. The electrostatic chuck system pulls the holding sheet 22 onto the stage 111 and secures it thereto. Although a description will be made below of a case where the electrostatic chuck system is used as a securing system for securing the holding sheet 22 to the stage 111, this should not be taken as a limitation. A clamp (not shown) may be used for securing the holding sheet 22 to the stage 111.

The metal layer 116 is formed of, for example, aluminum with an anodic oxidation coating. The metal layer 116 contains a coolant channel 127 configured to cool the stage 111. By cooling the stage 111, the holding sheet 22 set on the stage 111 is cooled down, and the cover 124 partially in contact with the stage 111 is also cooled down. This protects the substrate 10 and the holding sheet 22 from being damaged by being heated during plasma processing. A coolant in the coolant channel 127 is circulated by a coolant circulator 125.

Around the peripheral portion of the stage 111, a plurality of support members 122 extending through the stage 111 are provided. The support members 122 support the frame 21 of the conveying carrier 20. The support members 122 are driven by a first lifting system 123A, and move upward and downward. The conveying carrier 20 having delivered into the vacuum chamber 103 is passed onto the support members 122 at a predetermined raised position. Then the support members 122 descend until their top surfaces become flush with or lower than the top surface of the stage 111, which sets the conveying carrier 20 at a predetermined position on the stage 111.

A plurality of lifting rods 121 are coupled to the peripheral edge of the cover 124, to lift and lower the cover 124. The lifting rods 121 are driven by a second lifting system 123B. The lifting and lowering operation of the cover 124 by the second lifting systems 123B can be controlled independently from the operation by the first lifting system 123A.

Figure 12:
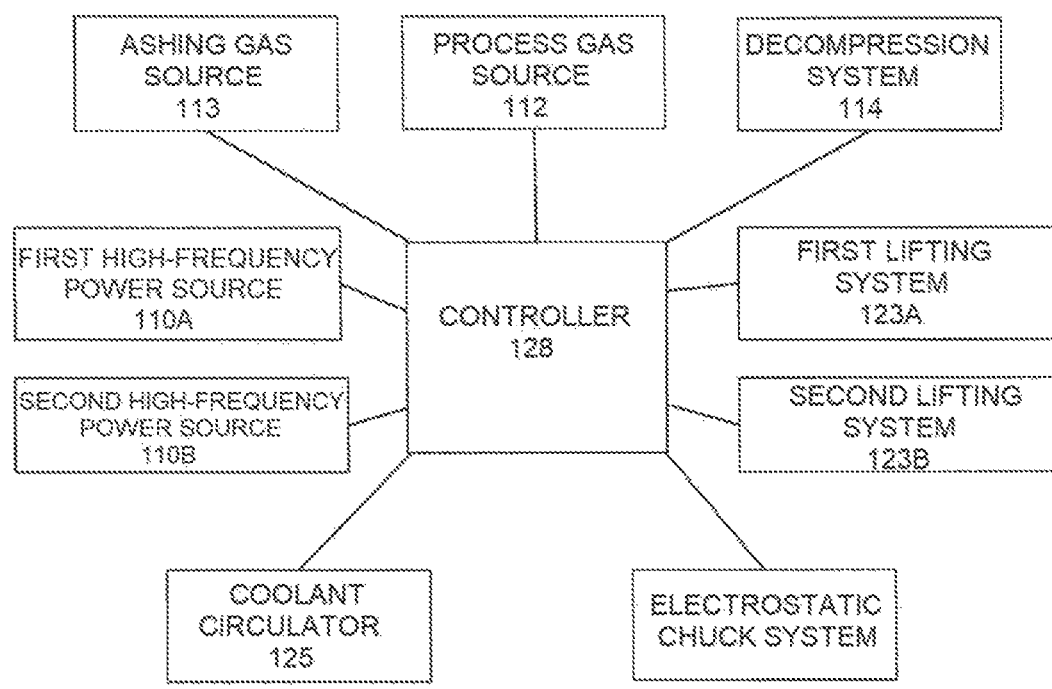
FIG. 12 is a block diagram of the plasma processing apparatus used in the embodiment of the present invention.

A controller 128 is configured to control operations of component elements of the plasma processing unit 100 including the first high-frequency power source 110A, the second high-frequency power source 110B, the process gas source 112, the ashing gas source 113, the decompression system 114, the coolant circulator 125, the first and second lifting systems 123A and 123B, and the electrostatic chuck system. FIG. 12 is a block diagram of the plasma processing apparatus used in the present embodiment.

After the conveying carrier 20 holding the substrate 10 is delivered into the vacuum chamber 103, the substrate 10 is subjected to etching while being seated on the stage 111.

When delivering the substrate 10, within the vacuum chamber 103, the cover 124 is lifted to a predetermined position by means of the lifting rods 121. A gate valve (not shown) opens to allow the conveying carrier 20 to be delivered into the vacuum chamber 103. The support members 122 are on standby at a raised position. When the conveying carrier 20 reaches a predetermined position above the stage 111, the conveying carrier 20 is passed onto the support members 122. The conveying carrier 20 is placed onto the support members 122, with the adhesive side 22X of the holding sheet 22 faced upward.

After the conveying carrier 20 is passed onto the support members 122, the vacuum chamber 103 is closed in a hermetically sealed state. Next, the support members 122 start descending. When the support members 122 have descended until their top surfaces become flush with or lower than the top surface of the stage 111, the conveying carrier 20 is set on the stage 111. Then the lifting rods 121 are driven to lower the cover 124 to a predetermined position. The distance between the cover 124 and the stage 111 is adjusted so that the holding members 107 in the cover 124 each come in point-contact with the frame 21. In this way, the frame 21 is pressed downward by the holding members 107, and covered with the cover 124, with at least part of the substrate 10 exposed from the window 124W.

The cover 124 is, for example, doughnut-shaped having an approximately circular outline, and has a consistent width and thin thickness. The diameter of the window 124W is smaller than the inner diameter of the frame 21, and the outer diameter thereof is greater than the outer diameter of the frame 21. Therefore, when the cover 124 is lowered while the conveying carrier 20 is set on the stage at a predetermined position, the cover 124 can cover the frame 21, with at least part of the substrate 10 exposed from the window 124W.

The cover 124 is formed of, for example, a dielectric such as ceramics (e.g., alumina, aluminum nitride) or quarts, or a metal such as aluminum or aluminum with an anodic oxidation coating. The holding members 107 can be formed of the aforementioned dielectric or metal, or a resin material.

After the conveying carrier 20 is passed onto the support members 122, a voltage is applied to the ESC electrode 119 from the DC power source 126. By doing this, the holding sheet 22 is brought into contact with the stage 111 and concurrently, is electrostatically chucked on the stage 111. The voltage application to the ESC electrode 119 may be initiated after the holding sheet 22 is set on (or comes in contact with) the stage 111.

Upon completion of etching, the gas in the vacuum chamber 103 is evacuated, and the gate valve opens. The conveying carrier 20 holding a plurality of element chips is delivered out of the plasma processing unit 100 by means of a conveying system having entered through the gate valve. After the conveying carrier 20 is delivered out, the gate valve is immediately closed. The conveying carrier 20 may be delivered out by performing the above-mentioned procedures of setting the conveying carrier 20 on the stage 11 in the reverse order. Specifically, after the cover 124 is lifted to a predetermined position, the voltage applied to the ESC electrode 119 is cut off, to release the chucking of the conveying carrier 20 to the stage 111. Then, the support members 122 are raised. After the support members 122 reach a predetermined raised position, the conveying carrier 20 is delivered out of the vacuum chamber 103.

The conditions for generating a first plasma used for etching the semiconductor layer may be set according to the material of the semiconductor layer and other factors.

The semiconductor layer is plasma-etched by, for example, a Bosch process. In the Bosch process, the semiconductor layer is etched vertically in the depth direction. When the semiconductor layer contains Si, the Bosch process repeats a film deposition step, a deposited-film etching step, and a Si etching step in this order, thereby to dig the semiconductor layer in the depth direction.

The film deposition step is carried out, for example, under the following conditions: while supplying $C_4F_8$ as a process gas at a rate of 150 sccm to 250 sccm, the pressure in the vacuum chamber is controlled to 15 Pa to 25 Pa, with the input power to the first electrode from the first high-frequency source set at 1500 W to 2500 W, and the input power to the second electrode from the second high-frequency power source set at 0 W to 50 W; the processing time is 2 sec to 15 sec.

The deposited-film etching step is carried out, for example, under the following conditions: while supplying $SF_6$ as a process gas at a rate of 200 sccm to 400 sccm, the pressure in the vacuum chamber is controlled to 5 Pa to 15 Pa, with the input power to the first electrode from the first high-frequency power source set at 1500 W to 2500 W, and the input power to the second electrode from the second high-frequency power source set at 300 W to 1000 W; the processing time is 2 sec to 10 sec.

The Si etching step is carried out, for example, under the following conditions: while supplying $SF_6$ as a process gas at a rate of 200 sccm to 400 sccm, the pressure in the vacuum chamber is controlled to 5 Pa to 15 Pa, with the input power to the first electrode from the first high-frequency power source set at 1500 W to 2500 W, the input power to the second electrode from the second high-frequency power source set at 50 W to 500 W; the processing time is 10 sec to 20 sec.

By repeating the film deposition step, the deposited-film etching step, and the Si etching step under the conditions as above, the semiconductor layer containing Si can be etched vertically in the depth direction at a rate of 10 μm/min to 20 μm/min.

Figure 13:
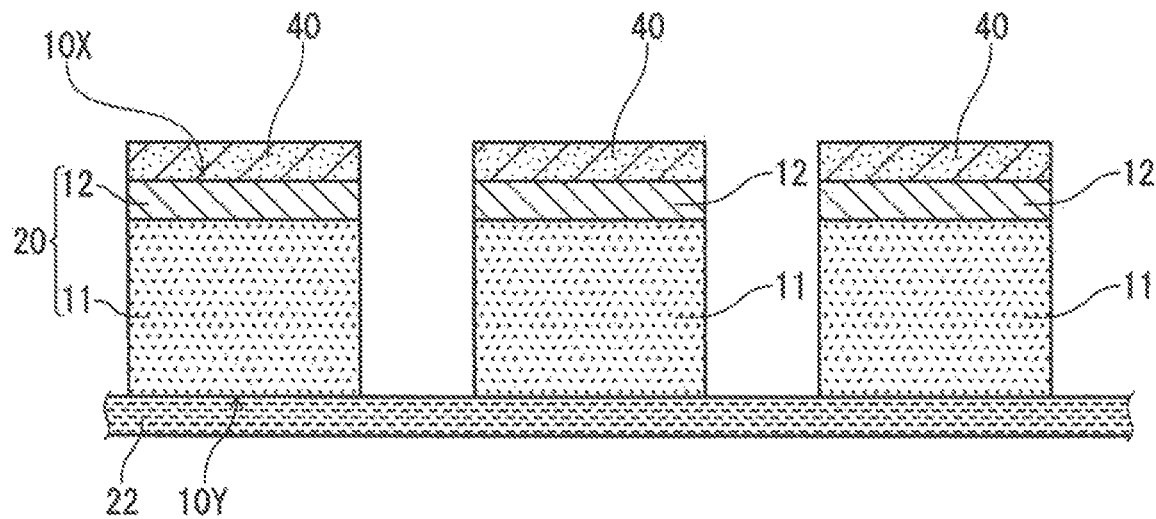
FIG. 13 is a schematic cross-sectional view of element chips produced in a plasma dicing step according to the embodiment of the present invention.

FIG. 13 is a schematic cross-sectional view of the element chips produced in the plasma dicing step according to the present embodiment. The dicing region of the substrate is etched away, and a plurality of the element chips 200 are formed from the substrate. The wiring layer 12 of each element chip 200 is covered with the resin film 40.

(6) Resin Film Removal Step (S15)

A resin film removal step is executed by the first cleaning step (ii) and the second cleaning step (iii) as described above in the element chip cleaning method. The element chips are prepared, through the process from the substrate preparation step to the plasma dicing step, in a state held on the holding sheet. According to the aforementioned cleaning method, high-quality element chips can be obtained.

Before supplying the first cleaning liquid to the element chip, the element chip may be exposed to a plasma generated from a gas containing oxygen, to slightly ash the resin film. Ashing of the resin film is, for example, carried out successively after the plasma dicing step in the same plasma processing apparatus.

Figure 14:
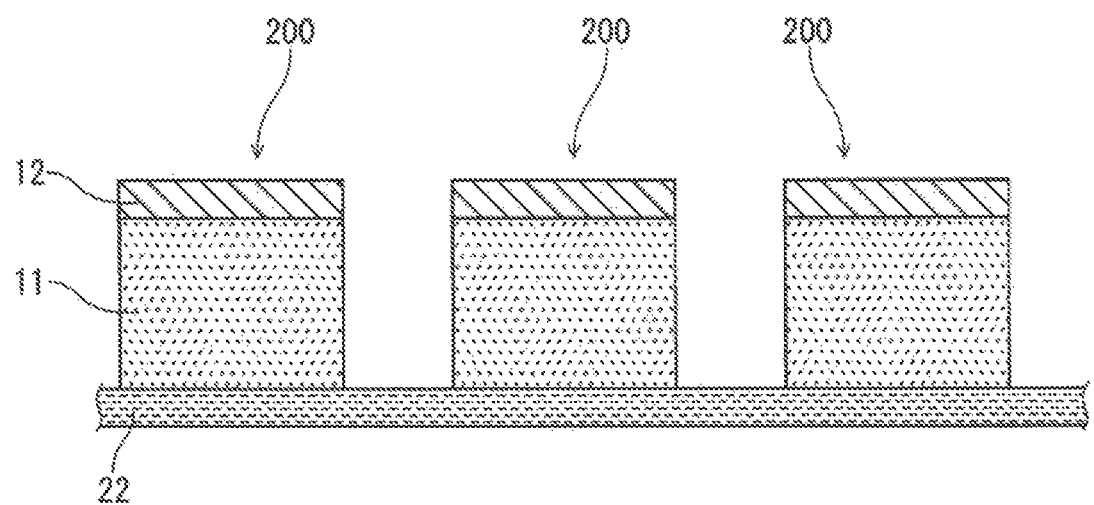
FIG. 14 is a schematic cross-sectional view of the element chips after a resin removal step according to the embodiment of the present invention.

FIG. 14 is a schematic cross-sectional view of the element chips after the resin film removal step according to the present embodiment. The resin film 40 covering the wiring layer 12 of the element chip 200 is removed.

After the resin film removal step, the element chips are detached from the holding sheet.

The element chips are thrust upward together with the holding sheet with thrust-up pins from the non-adhesive side of the holding sheet. This allows at least part of the element chip to separate from the holding sheet. The element chips are then detached from the holding sheet.

The cleaning method and the cleaning apparatus of the present invention can remove the resin film with less damage to the element chips, and therefore is particularly suitably applicable to manufacturing of element chips by plasma dicing.

REFERENCE NUMERALS

10: substrate
 10X: first surface
 10Y: second surface
  11: semiconductor layer
  12: wiring layer
20: conveying carrier
21: frame
  21a: notch
  21b: corner cut
22: holding sheet
  22X: adhesive side
  22Y: non-adhesive side
  221: peripheral region
40: resin film
50A: first cleaning liquid
50B: second cleaning liquid
100: plasma processing apparatus
103: vacuum chamber
  103a: gas inlet
  103b: gas outlet 108: dielectric member
109: first electrode
110A: first high-frequency power source
110B: second high-frequency power source
111: stage
112: process gas source
113: ashing gas source
114: decompression system
115: electrode layer
116: metal layer
117: base table
118: peripheral member
119: ESC electrode
120: second electrode
121: lifting rod
122: support member
123A, 123B: lifting system
124: cover
124W: window
125: coolant circulator
126: DC power source
127: coolant channel
128: controller
129: circumferential ring
200: element chip
300: cleaning apparatus
301A: first supply unit (first nozzle)
301B: second supply unit (second nozzle)
303: controller
304: moving unit
305: rotation unit

What is claimed is:

1. An element chip cleaning method comprising:
an element chip preparation step of preparing at least one element chip having a first surface and a second surface opposite the first surface, the first surface covered with a resin film;
a first cleaning step of bringing a first cleaning liquid into contact with the resin film, the first cleaning liquid including a solvent that dissolves at least part of a resin component contained in the resin film; and
a second cleaning step of spraying a second cleaning liquid against the resin film from the first surface side of the element chip, after the first cleaning step,.
wherein in the preparation step, a plurality of the element chips are prepared, and the plurality of the element chips are attached at the second surface on a holding sheet secured to a frame surrounding the plurality of the element chips, so as to have gaps between the plurality of the element chips, the frame being thicker than the plurality of element chips,
wherein in the first cleaning step, the first cleaning liquid is supplied in such an amount that a peripheral region of the holding sheet comes in contact with the first cleaning liquid, the peripheral region being a region where the plurality of the element chips are not attached.

2. The element chip cleaning method of claim 1, wherein in the second cleaning step, the second cleaning liquid and a carrier gas are mixed and sprayed together from a nozzle against the resin film.

3. The element chip cleaning method of claim 1, wherein in the first cleaning step, the first cleaning liquid is discharged toward the resin film from the first surface side.

4. The element chip cleaning method of claim 1, wherein the first cleaning step is performed while the element chip is rotated about a line normal to the first surface.

5. The element chip cleaning method of claim 1, wherein the second cleaning step is performed while the element chip is rotated about a line normal to the first surface.

6. The element chip cleaning method of claim 1, wherein in the first cleaning step, the first cleaning liquid is supplied so as to fill the gaps between the plurality of the element chips.

7. An element chip manufacturing method comprising:
a substrate preparation step of preparing a substrate having a plurality of element regions and a dicing region defining the element regions, the substrate having a first surface and a second surface opposite the first surface;
a holding step of attaching the substrate at the second surface to a holding sheet secured to a frame surrounding the substrate, the frame being thicker than the substrate;
a resin film formation step of forming a resin film that covers the first surface;
an opening formation step of forming an opening in the resin film, to expose the dicing region on the first surface;
a plasma dicing step of plasma-etching the exposed dicing region starting from the first surface until etched to the second surface, to divide the substrate into a plurality of element chips; and
a resin film removal step of removing the resin film covering the first surface from the element chips, after the plasma dicing step, wherein
the resin film removal step includes:
a first cleaning step of bringing a first cleaning liquid into contact with the resin film, the first cleaning liquid including a solvent that dissolves at least part of a resin component contained in the resin film; and
a second cleaning step of spraying a second cleaning liquid to the resin film from the first surface side of the element chips, after the first cleaning step,
wherein in the first cleaning step, the first cleaning liquid is supplied in such an amount that a peripheral region of the holding sheet comes in contact with the first cleaning liquid, the peripheral region being a region where the substrate is not attached.

8. The element chip cleaning method of claim 1, wherein the plurality of the element chips are exposed to a plasma generated from a gas containing oxygen before the first cleaning step.

9. The element chip manufacturing method of claim 7, wherein the plurality of the element chips are exposed to a plasma generated from a gas containing oxygen before the first cleaning step.

* * * * *